(12) United States Patent
Qian et al.

(10) Patent No.: US 7,376,920 B2
(45) Date of Patent: May 20, 2008

(54) METHOD TO MONITOR CRITICAL DIMENSION OF IC INTERCONNECT

(75) Inventors: Hua Qian, Shanghai (CN); Ching Thiam Chung, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 133 days.

(21) Appl. No.: 11/398,980

(22) Filed: Apr. 6, 2006

(65) Prior Publication Data
US 2007/0247167 A1 Oct. 25, 2007

(51) Int. Cl.
G06F 9/45 (2006.01)
G06F 17/50 (2006.01)
G01R 31/08 (2006.01)
G01R 31/02 (2006.01)
G01R 27/00 (2006.01)
G01R 13/00 (2006.01)

(52) U.S. Cl. ............... 716/5; 324/522; 324/537; 702/65; 702/66

(58) Field of Classification Search .......... 716/5
See application file for complete search history.

(56) References Cited

U.S. PATENT DOCUMENTS

| | | | |
|---|---|---|---|
| 6,242,757 B1 | 6/2001 | Tzeng | |
| 6,573,498 B1 * | 6/2003 | Rangarajan et al. | 250/307 |
| 6,754,593 B1 | 6/2004 | Stewart et al. | |
| 6,891,627 B1 | 5/2005 | Levy | |
| 2002/0102472 A1 | 8/2002 | Chan | |
| 2002/0107650 A1 | 8/2002 | Wack et al. | |
| 2003/0155933 A1 | 8/2003 | Wang | |
| 2005/0017171 A1 * | 1/2005 | Samuelson et al. | 250/306 |
| 2005/0266652 A1 * | 12/2005 | Chudzik et al. | 438/387 |

OTHER PUBLICATIONS

Jason P. Cain and Costas J. Spanos, Electrical linewidth metrology for systematic CD variation characterization and causal analysis, found Jul. 18, 2005 on website (see below). http://www.eecs.berkeley.edu/~neureuth/FLCC/papers/spie_mi_5038-35.pdf , 12 pages, Department of Electrical Engineering and Computer Sciences, University of California.

* cited by examiner

*Primary Examiner*—Phallaka Kik
*Assistant Examiner*—Aric Lin
(74) *Attorney, Agent, or Firm*—Horizon IP Pte Ltd

(57) ABSTRACT

An example method of monitoring and measuring the line width of interconnects comprising the following steps. First, we measure an I-V profile of a sample interconnect structure to obtain a sample I-V profile. The I-V profile is comprised of leakage current measurements at two or more voltages. The sample interconnect structure is comprised of spaced lines having a line spacing. Next we compare the sample I-V profile with a reference I-V profile at a reference line spacing to determine if sample interconnect structure is not defective. If the sample I-V profile is similar to the reference I-V profile, then leakage currents for the sample interconnect structure are derived from the I-V profiles at a selected voltages. Then we calculate the line spacing of the sample interconnect structure using the sample I-V profile.

14 Claims, 5 Drawing Sheets

| | Baseline | New |
|---|---|---|
| Line space (m) | 0.237 | 0.227 |
| Leakage (A) @ 2.0 M V/Cm | 1.591 E-09 | 2.478 E-09 |

|  | Pattern 1 | Pattern 2 | Change |
|---|---|---|---|
| Line space (um) | 0.237 | 0.227 | -4.22% |
| ILeakage (A) @2MV/cm | 1.591E-09 | 2.478E-09 | 55.75% |
| ILeakage (A) @3MV/cm | 1.013E-07 | 1.734E-07 | 71.19% |

METHOD TO MONITOR CRITICAL DIMENSION OF IC INTERCONNECT

BACKGROUND OF INVENTION

1) Field of the Invention

This invention relates generally to methods for the electrical measurement of critical dimensions and more particularly to electrical measurement of line spacing of conductive structures in semiconductor devices.

2) Description of the Prior Art

An important driver for keeping Moore's Law is the improvement in productivity of semiconductor manufacturing. This is accomplished by the constant shrinking of device structures. The main burden of this shrink roadmap is carried by the lithography, which is currently pushed to its physical limits. The lithography process and exposure tools require an ever growing effort and support from metrology and inspection. New procedures are needed here to guarantee the required precision and accuracy specifications as well as the requirements for throughput and statistical significance.

The low-voltage scanning electron microscope (SEM) is a main metrology tool for critical dimension (CD) monitoring. Typically, the time required for CD-SEM measurement limits the number of measurement sites to be collected per wafer. However, some applications require a metrology tool, which is able to collect large amounts of data within a short time frame to obtain statistically significant results on the complete image fields. One example is the characterization of lithographic exposure tools based on an assessment of their actual printing performance by measurement of line spacing.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

Jason P. Cain and Costas J. Spanos, Electrical linewidth metrology for systematic CD variation characterization and casual analysis, found Jul. 18, 2005 on website, 12 pages, Department of Electrical Engineering and Computer Sciences, University of California, Berkeley, Calif. 94720

U.S. Pat. No. 6,573,498: Electric measurement of reference sample in a CD-SEM and method for calibration—Scanning electron microscope calibrating method for semiconductor device manufacture, involves correlating optical workpiece measurement with reference sample feature critical dimension Inventor: Rangarajan, Bharath; et al.

US20030155933A1: Dielectric test structure and test method—Dielectric layer test structure for semiconductor device manufacture, has line pads and conductive layers formed inside dielectric layer—Inventor: Wang, Mu-Chun U.S. Pat. No. 6,754,593: Method and apparatus for measuring defects—Workpiece e.g. microprocessor defect measuring method, involves measuring defect characteristics at each of measurement sites on workpiece responsive to measured defect characteristics being greater than predetermined threshold Inventor: Stewart, Edward C.; Buda, Tex.

U.S. Pat. No. 6,891,627: Methods and systems for determining a critical dimension and overlay of a specimen—Specimen properties determining system for semiconductor fabrication process, determines critical dimension and overlay misregistration of specimen based on output signals generated by measurement device Inventor: Levy, Ady U.S. Pat. No. 6,242,757: Capacitor circuit structure for determining overlay error—Error determination structure for integrated circuit manufacture, has pairs of contact areas which oppose sides of square, so that capacitor areas are extended inwards and overlapping sides of square—Inventor: Tzeng, Kuo-Chyuan US20020107650A1: Methods and systems for determining a critical dimension and a presence of defects on a specimen—Specimen properties determining system for semiconductor fabrication process, determines critical dimension and overlay misregistration of specimen based on output signals generated by measurement device Inventor: Wack, Dan; et al.

US20020102472A1: Electrical critical dimension measurements on photomasks—Test structure for measuring critical distances on photomasks, includes cross-resistor, bridge resistor and split-bridge structures connected to image line, for performing sheet resistance and other measurements—Inventor: Chan, David Y.; Austin, Tex., United

SUMMARY OF THE INVENTION

The embodiments of the present invention provides a method for measuring the critical dimensions of a structure which is characterized as follows.

An example embodiment for a method of monitoring and measuring the critical dimensions of interconnects comprises the steps of:
    measuring an I-V profile of a sample interconnect structure to obtain a sample I-V profile comprising leakage current measurements at two or more voltages;
        the sample interconnect structure is comprised of spaced lines having a line spacing;
    comparing the sample I-V profile with a reference I-V profile at a reference line spacing to determine if sample interconnect structure is not defective;
        If the sample I-V profile is similar to the reference I-V profile, then leakage currents for the sample interconnect structure are derived from the I-V profiles at a selected voltage; and
    calculating the line spacing of the sample interconnect structure, using the sample I-V profile.

An example embodiment for a method of monitoring and measuring the line spacing of interconnects comprises the steps of:
    measuring an I-V profile of a reference interconnect structure with a reference line spacing to obtain a reference I-V profile; the reference interconnect structure is at least partially in a reference insulation layer;
        the reference interconnect structure is comprised of spaced lines having a line spacing;
        the I-V profile is comprised of leakage current measurements at two or more voltages;
        the reference interconnect structure is comprised of a comb-shaped section;
    measuring the line spacing of the reference interconnect structure by a SEM or TEM technique;
    measuring an I-V profile of a sample interconnect structure to obtain a sample I-V profile;
    comparing the sample I-V profile with the reference I-V profile at a reference line spacing to determine if the sample interconnect structure is not defective;
        if the sample I-V profile is significantly different than the reference I-V profile, then a process defect is determined to exist in the sample interconnect structure;

If the sample I-V profile is similar to the reference I-V profile, then leakage currents for the sample interconnect structure are derived from the I-V profiles at a selected voltage;

calculating the line spacing of the sample interconnect structure using the sample I-V profile.

An aspect comprises wherein the step of calculating the line spacing of the sample interconnect structure using the sample I-V profile comprising using equation 7 or equation 8:

$$\ln\left(\frac{J}{J_0}\right) = \frac{0.0146}{\sqrt{k_i}} \sqrt{\frac{V}{D_0}} \left[\left(\frac{D_0}{D}\right)^{1/2} - 1\right];\quad \text{Equation (7)}$$

$$\text{or } \ln\left(\frac{J}{J_0}\right) = \ln\left(\frac{D_0}{D}\right) + \frac{0.0292}{\sqrt{k_i}} \sqrt{\frac{V}{D_0}} \left[\left(\frac{D_0}{D}\right)^{1/2} - 1\right].\quad \text{Equation (8)}$$

Additional example embodiments are described in the claims and following specification.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no interference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a method according to the present invention and further details of the method for measuring the CD of a device in accordance with the present invention will be more clearly understood from the following description taken in conjunction with the accompanying drawings in which like reference numerals designate similar or corresponding elements, regions and portions and in which.

DETAILED DESCRIPTION OF THE EXAMPLE EMBODIMENTS

A. Introduction

Example embodiments can measure and monitor the interconnect/line spacing (critical dimensions of line spacing) on a sample work piece. The conductive line(s) are preferably insulated by a dielectric. The line spacing is the distance between adjacent conductive line segments. The line spacing is the thickness of the dielectric between the adjacent line segments.

Below the method and equations used to calculate line spacing are described.

In the following section, a process is described to test sample interconnect structures for leakage current at various voltages (I-V profiles) and used the I-V profiles to calculate the line spacing for the sample.

B. Terminology

CD—critical dimension—minimum dimensions allowable by design rules.

Line spacing—distance between two adjacent (conductive) line segments.—distance between adjacent elements. For example, the minimum spacing between adjacent metal lines.

Figure 5:
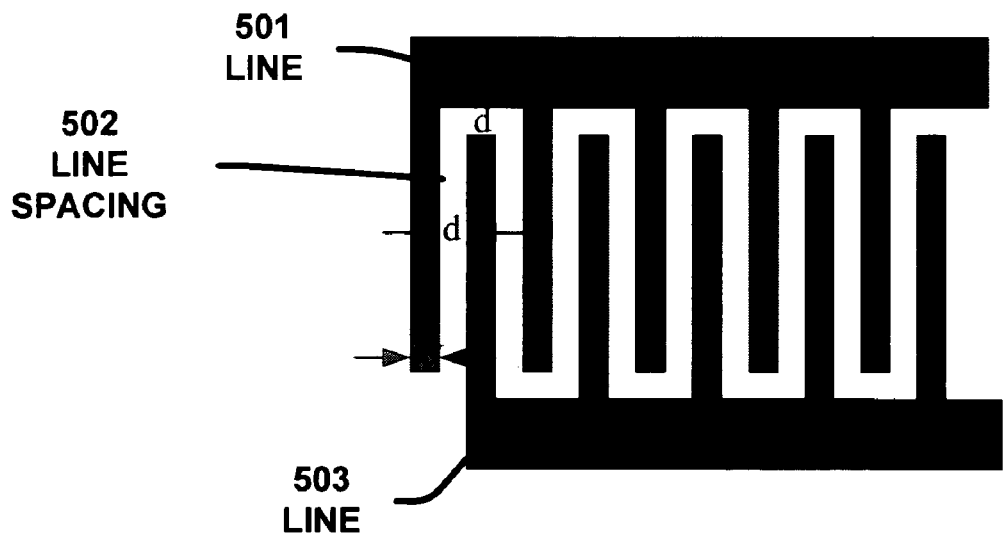
FIG. 5 is a top down view of an interconnect structure used to measure the leakage current according to an example embodiment of the present invention.

C. leakage current profile (I-V profile) is very sensitive to the dielectric thickness between the metal lines FIG. 5 shows a top down view of a preferred test structure that is used to measure the leakage current between conductive lines. FIG. 5 shows a comb shaped structure where two conductive lines have "comb extensions" that are interweaved.

To measure the leakage current between the two lines, a voltage is placed between the two lines and the current flow (leakage current) is measured. In this embodiment, I-V (current vs voltage) data is collected over a range of voltages to obtain a I-V profile (or leakage current profile).

Figures 7, 8:
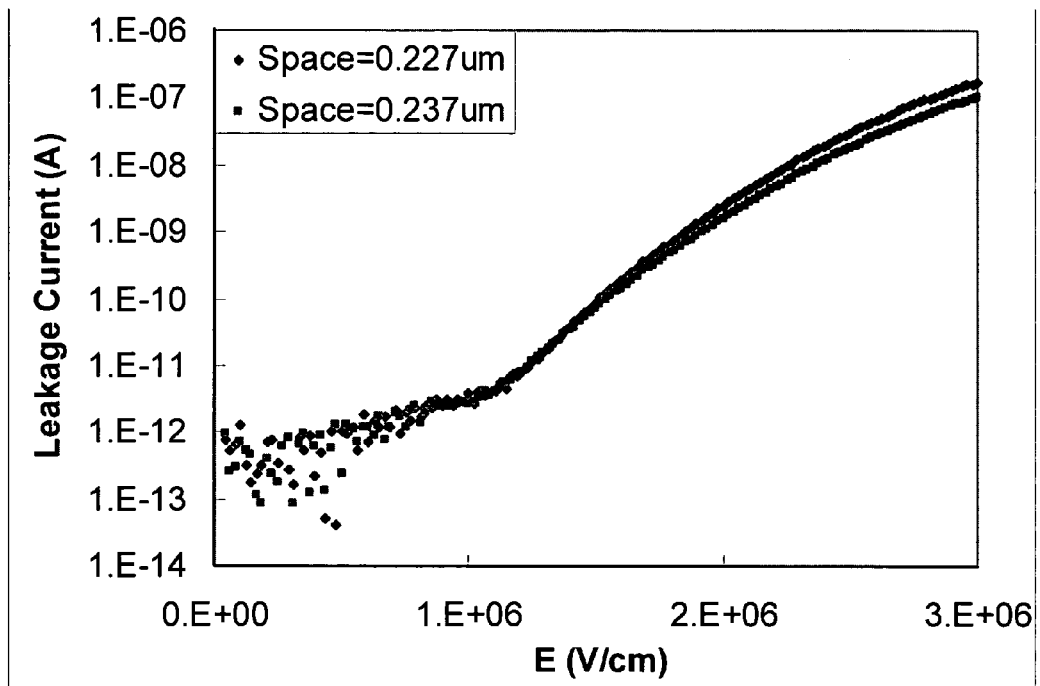
FIG. 7 is a plot of (I-V) Leakage current vs E (V/cm) for a two interconnect structures with line spacing of 0.227 µm and 0.237 µm according to an example embodiment of the present invention.
FIG. 8 is a table showing the (I-V) Leakage current at 2 difference voltages and line spacing according to an example embodiment of the present invention.

The leakage current profile is very sensitive to the thickness of the dielectric between the metal lines (such as comb extensions). FIG. 7 shows the I-V profiles for two line spacing (0.227 and 0.237 micron). FIG. 8 shows a table showing the leakage current for test structures with two line spacings (e.g., dielectric thickness between two adjacent interconnects or lines) at two different voltages. The percent change column shows that the leakage current is very sensitive to changes in line spacing. The line spacings (dielectric thickness) between line segments of the two test structures were measured with an optical technique.

calculate line spacing from leakage measurements at different voltages (I-V profiles)

It is thought that there are five conduction processes found in the dielectrics. They are Schottky emission, Frenkel-Poole emission, Fowler-Nordheim tunneling, space charge limited current, and ionic conduction. Among them Schottky emission and Frenkel-Poole emission are 2 major conduction mechanisms in the typical stressed electric field.

Schottky emission can be described by the equation $$J = AT^2 \exp\left[\frac{-q(\phi_B - \sqrt{qE/4\pi\varepsilon_i})}{kT}\right] \quad \text{Equation (1)}$$

Frenkel-Poole emission follows the equation:

$$J = qn_0\mu E \exp\left[-\frac{q}{kT}(\phi_B - \sqrt{\frac{qE}{\pi\varepsilon_i}})\right] \quad \text{Equation (2)}$$

where
J is the current density,
A is the Richardson constant,
T is the absolute temperature,
q is the electronic charge,
$\phi_B$ is the potential barrier at the metal/dielectric interface,
E is the electric field in the dielectric,
$\varepsilon_i$ is the dielectric constant,
k is the Boltzmann constant, and
$\mu$ is the electron mobility.

It can be expressed that $$\frac{dJ}{J} = \frac{1}{2}\frac{\beta}{\sqrt{k_i}}\sqrt{E}\frac{dE}{E} \quad \text{Equation (3)}$$

for Schottky emission and $$\frac{dJ}{J} = \left(1 + \frac{\beta}{\sqrt{k_i}}\sqrt{E}\right)\frac{dE}{E} \quad \text{Equation (4)}$$

for Frenkel-Poole emission, where $$\beta = \frac{-q\sqrt{q/4\pi\varepsilon_0}}{kT}$$

can be calculated to be 0.0146 and $k_i$ is the dielectric constant.

As the voltage is stressed between the metal lines, the accurate electric field is very difficult to be calculated. But it can be estimated using infinite large plate approximation and be expressed to be $$E = \frac{V}{D} \quad \text{Equation (5)}$$

where D is the dielectric thickness. It can be further expressed to be $$\frac{dE}{E} = -\frac{dD}{D} \quad \text{Equation (6)}$$

So the relationship between the leakage current and dielectric thickness can be expressed to be $$\ln\left(\frac{J}{J_0}\right) = \frac{0.0146}{\sqrt{k_i}}\sqrt{\frac{V}{D_0}}\left[\left(\frac{D_0}{D}\right)^{1/2} - 1\right] \quad \text{Equation (7)}$$

for Schottky emission mechanism. Following the same procedure, it can be derived that $$\ln\left(\frac{J}{J_0}\right) = \ln\left(\frac{D_0}{D}\right) + \frac{0.0292}{\sqrt{k_i}}\sqrt{\frac{V}{D_0}}\left[\left(\frac{D_0}{D}\right)^{1/2} - 1\right] \quad \text{Equation (8)}$$

for Frenkel-Poole emission mechanism, $J_0$ is the current density corresponding to the dielectric thickness of $D_0$, while J corresponding to D.

The dominated leakage current mechanism depends on the dielectric materials, stress voltage and temperature. It has been found that for silicon oxide ($SiO_2$) the Schottky emission is the dominant conduction mechanism at the electric field below 1 MV/cm, while Frenkel-Poole emission governs the leakage current at the electric field between 1 MV/cm and 2 MV/cm at room temperature.

Figures 3, 4:
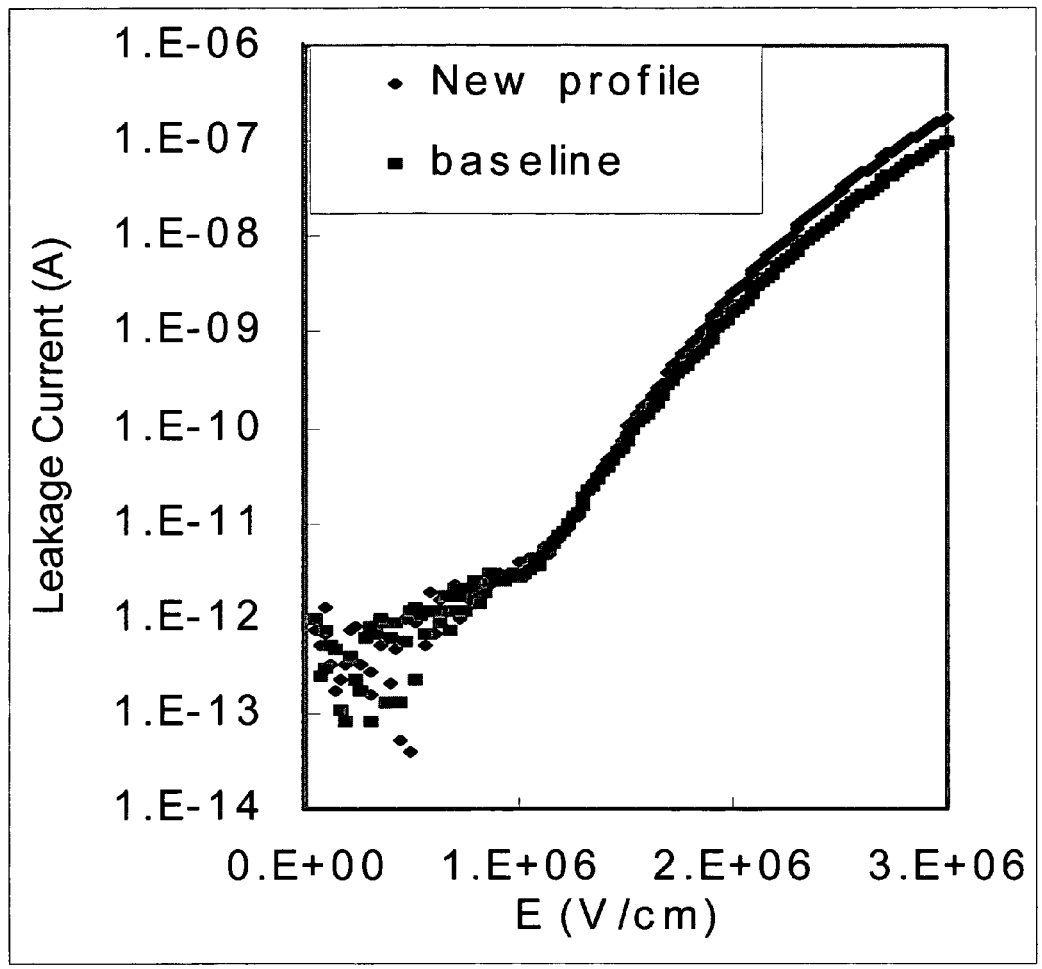
FIG. 3 is a plot of (I-V) Leakage current vs E (V/cm) for a reference interconnect structure and a sample interconnect according to an example embodiment of the present invention.
FIG. 4 is a table which shows the line spacing and iLeakage for a references (reference and sample).

In FIG. 3, we compare I-V profiles between patterns with line spacing of 0.237 μm and 0.227 μm. It can be seen that I-V profiles overlap in the small electric field region, but are clearly separated in the large electric field region, even though that the line spacing only changes 4%.

The leakage current at the electric field of 1.6 MV/cm and 2.0 MV/cm of 2 patterns are obtained from FIG. 3 and listed in Table 1. It can be seen that the leakage current increases 33.57% and 55.75% at the electric field of 1.60 MV/cm and 2.0 MV/cm respectively as the line spacing reduces around 4%.

TABLE 1

The leakage current change vs line space

|  | Pattern 2 | Pattern 1 | Change |
|---|---|---|---|
| Line spacing (μm) | 0.237 | 0.227 | −4.2% |
| ILeakage (a) @ 1.6 M V/cm | 1.4E−10 | 1.87E−10 | 33.57% |
| ILeakage (a) @ 2.0 M V/cm | 1.591E−09 | 2.478E−09 | 55.75% |

TABLE 2

The line spacing calculated by leakage current measurement using Frenkel-Poole emission mechanism

|  | Measured by SEM | Calculated by Leakage Current | Variation |
|---|---|---|---|
| Leakage (A) @ 1.6 M V/cm | 0.2270 | 0.2287 | 0.75% |
| Leakage (A) @ 2.0 M V/cm | 0.2270 | 0.2260 | −044% |

The dielectric thickness (line spacing) of pattern 2 is calculated based on the dielectric current of pattern 1 and 2, and dielectric thickness of pattern 1 using Frenkel-Poole emission mechanism of Eq. (8).

Here, we briefly show an example of a line spacing calculation using the above example:
1. In the reference structure, the line spacing is measured to be $D_0=0.237$ μm by SEM
2. In the reference structure, the I-V curve is measured.
3. The conduction mechanism is found to be Frenkel-Poole emission at the electric field between 1 MV/cm and 2 MV/cm by fitting the I-V curve to equation (2). And leakage current is found to be $J_0=1.40$ E−10 A at E=1.6 MV/cm
4. In the sample structure, the I-V curve is measured. The leakage current is found to be J=1.87 E−10 A at the same E (=1.6 MV/cm).
5. The value of D can be found to be 0.227 μm from equation (8) by using the value of $J_0$, $D_0$ and J.

They are listed in table 2. It can be seen that the dielectric thickness calculated from the leakage current measurement is in good agreement with that measured from cross-sectional SEM. It clearly shows that Eq. (8) works very well.

It can be seen from the above discussion that the leakage current profile (I-V profile) between metal lines is a unique characteristic of the IC interconnect system. It is very sensitive to the dielectric thickness. Therefore, the example embodiments of the invention present a novel method to control and monitor the line CD of IC interconnects based on leakage current profile (I-V profile) measurement.

A software program can be used to calculate the line spacing thickness from the sample I-V profile so the technique can be used as metrology tool in a production line.

Software Program To Calculate Line Spacing

A software program could be developed to derive the thickness from the I-V profile if it is used as a metrology tool. A software program might address the following:
1. The electric field distribution between 2 lines is very complicated. As of yet, no simple analytical equation can be derived to calculate it. In this pattern, the infinite large plate approximation is used to derive the equation. It works very well in this case. However, if the method is developed for a metrology tool, a commercial software should be adopted to calculate the electric field.
2. In the second step, the leakage current mechanisms should be determined. Certain software should be used to do it.
3. Software should be used to check whether the difference between measured I-V profile and I-V profile baseline is from defects or due to the CD variation. Also the CD should be calculated from software.
4. CD measurement always requires huge amount of data, so commercial software must be developed for all calculations. Otherwise, the efficiency will be very low.

B. Review

It can be found from the above discussion that:
The leakage current profile (I-V profile) between metal lines is a unique characteristic of an IC interconnect system.
It is very sensitive to the spacing between metal lines.
The spacing between metal lines can be accurately derived from the leakage current (I-V profile).
Therefore, this embodiment presents a useful method to control and monitor the line CD of IC interconnects based on the leakage current profile (I-V profile) measurement.

Example Method To Measure And Monitor Line Spacing On Samples

An example embodiment of a method of monitoring the critical dimension (CD) of IC interconnects is described below.

A. steps

A flowchart of an example embodiment can comprise: (Also see FIG. 9)
1) Test structure to measure I-V profile is specially designed
   Comb structure is typically designed for I-V profile measurement
2) Establishment of I-V profile baseline in the specially designed structure
   Golden wafer is selected:
     Uniform CD
     No etch defect/CMP residue
     Good barrier layer
   I-V profile measurement
   Accurate CD measurement by SEM or TEM
3) I-V profile measurement of the structures in any locations/wafer
4) Compare the I-V profile with I-V profile baseline
   if profile is totally different from the baseline, process defects exist
   If the profile is similar to baseline, Leakage currents are calculated from the I-V profiles at certain E
5) Line spacing for sample is calculated using Eq. (7) or (8) based on the conducting mechanism.

Figure 9:
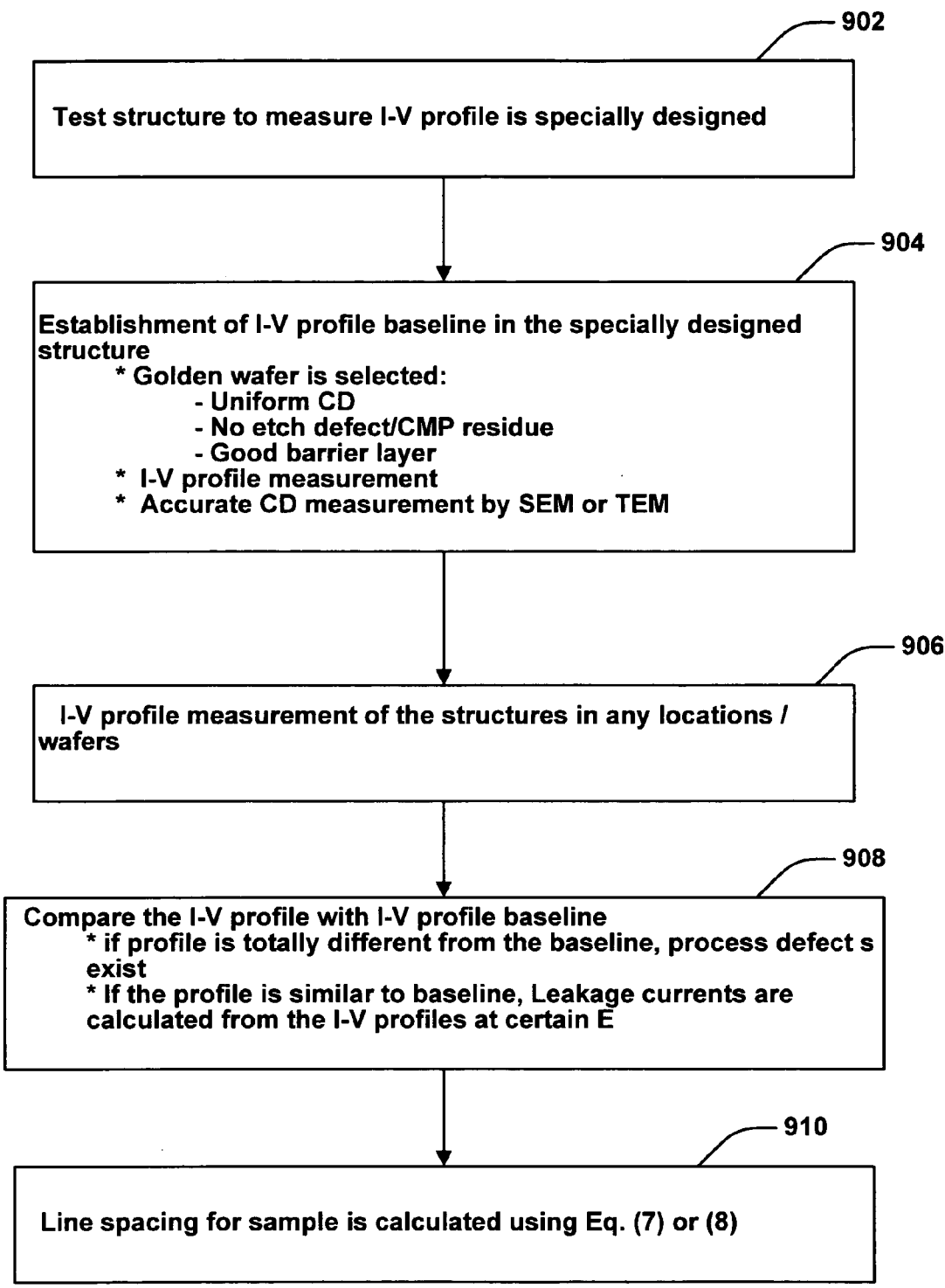
FIG. 9 is a flow chart (steps 902 904 906 908 910) of a method to measure I-V profiles and toe calculate the line spacing on a sample according to an example embodiment of the present invention.

This process is explained in more detail below. FIG. 9 is a flow chart of a method to measure I-V profiles and to calculate the line spacing on a sample.

B. provide a reference interconnect structure

Figure 6:
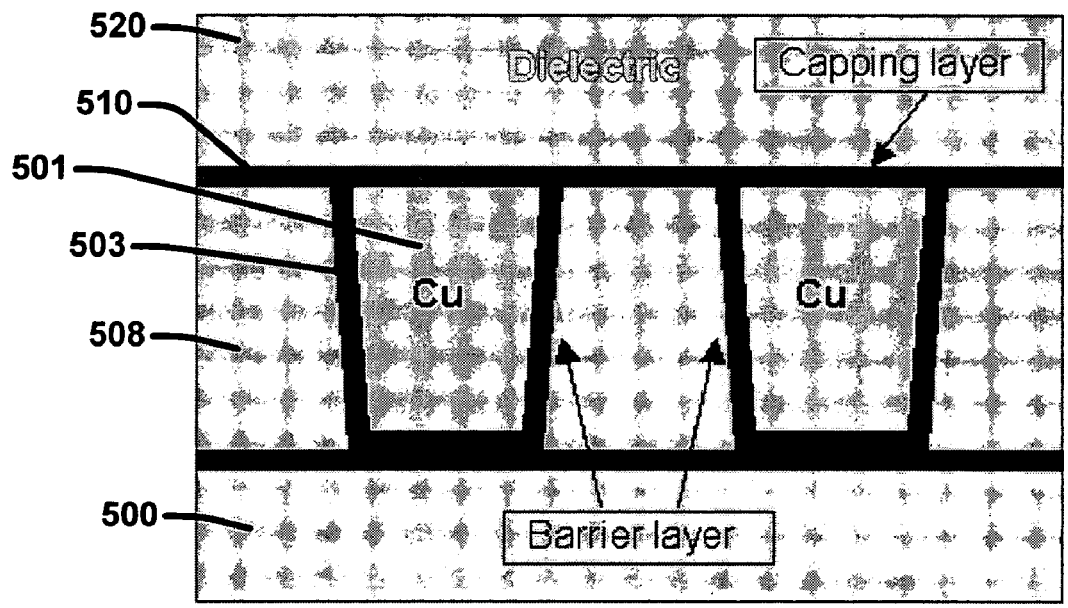
FIG. 6 is a cross sectional view for illustrating an interconnect test structure (comb structure) according to an example embodiment of the present invention.

First, the comb structure (reference interconnect structure) can be designed for the I-V profile measurement. As discussed above, FIG. 5 shows a top down view of a reference interconnect structure (comb structure). FIG. 6 shows a cross sectional view of the semiconductor structure 500, dielectric layer 508, metal line 501 (comb structure), barrier layer 503, capping layer 510 and overlying upper dielectric layer 520.

The interconnect 501 can be comprised of any conductive material such as copper.

Figure 1:
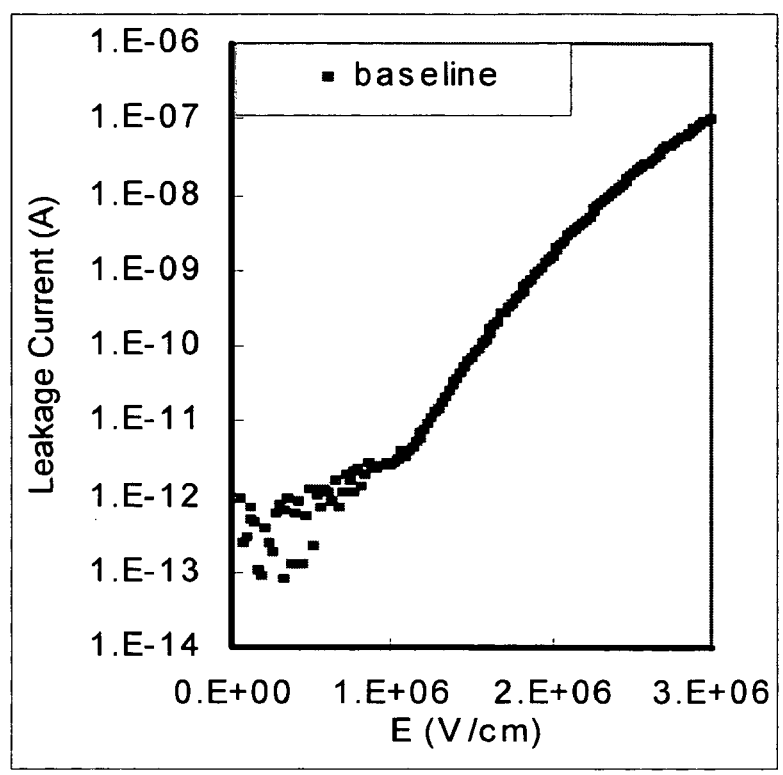
FIG. 1 is a plot of (I-V) Leakage current vs E (V/cm) for a reference interconnect structure according to an example embodiment of the present invention.

C. measuring a (reference) I-V profile of a reference interconnect (baseline interconnect) to obtain a reference I-V profile for a given reference line spacing We measure a I-V profile of a reference interconnect (baseline interconnect) to obtain a reference I-V profile (leakage current vs voltage) for a given reference line spacing (e.g., 502). FIG. 1 shows an example of a reference I-V profile.

The reference interconnect is preferably at least partially in a reference insulation. The reference interconnect is preferably metal line in a dielectric layer, such as an inter metal dielectric (IMD) layer. For example, the metal line can be a cooper damascene or dual damascene interconnect.

The I-V profile is measured in the structure of a golden wafer (reference wafer). A golden wafer means that the interconnect test structure is substantially free of defects such as etch defect, bridge, or Cu CMP residue, has a good barrier layer and CD is uniform. A good barrier layer means that the barrier layer is uniform without defects. As shown in FIG. 5, the reference interconnect test structure preferably has a comb shape when viewed from the top. FIG. 6 shows a cross sectional view.

Whether the wafer is a golden wafer or not can be checked by the I-V profile itself or detailed SEM observation. The accurate CD (line spacing) of this test reference interconnect structure is measured by SEM and/or TEM. The relationship between I-V profile on the reference test interconnect structure (referred to be I-V profile baseline) and the line CD is established.

Then the leakage current mechanism and the function range (electric field range) can be determined from the measured I-V profile by fitting Eq. (1) or (2). For example, it has been found that for the current silicon $Cu/SiO_2$ metallization system, the Schottky emission is the dominant conduction mechanism at the electric field below 1 MV/cm, while Frenkel-Poole emission governs the leakage current at the electric field between 1 MV/cm and 2 MV/cm at room temperature.

We measure the baseline I-V profile of the baseline interconnect to obtain the reference I-V profiles as shown in FIG. 1.

Measure the CD of the reference (baseline interconnect) by a SEM or TEM technique Next, we measure the CD of the reference (baseline) interconnect by using an optical technique such as a scanning electron microscope (SEM) or Transmission electron microscopy (TEM) technique. Transmission electron microscopy (TEM) is an imaging technique whereby a beam of electrons is focused onto a specimen causing an enlarged version to appear on a fluorescent screen or layer of photographic filmed, or can be detected by a CCD camera.

For example, the test structure shown in FIG. 5 is measured using a SEM from a top down orientation to obtain an optically measured line spacing. Preferably SEM measurements are taken at multiple points. Typically the minimum line spacing is taken to be the "optical" line spacing because it best correlates to the "electrically measured" line spacing (related to the minimum line spacing that leaks the most current at that point).

The spacing on FIG. 5 shows example locations and measurements of the line spacing 502. FIG. 5 shows first line 501 and second line 503.

For example, FIG. 6 shows a cross sectional view of the reference interconnect as viewed by an SEM. The wafer was cleaved and polished to get the cross sectional view.

D. measure an I-V profile of a sample interconnect in a sample insulating layer to obtain a sample I-V profile;

Next, we measure an I-V profile of a sample interconnect in a sample insulating layer to obtain a sample I-V profile (also called measured I-V profile). The sample interconnect can be an interconnect on another wafer, such as a product wafer or another work piece.

E. Compare the sample I-V profile with the reference I-V profile

Figure 2:
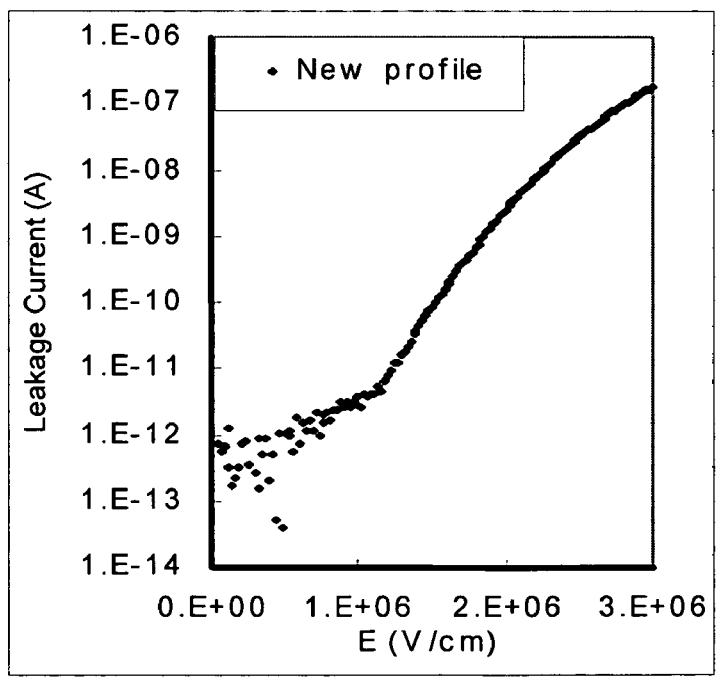
FIG. 2 is a plot of (I-V) Leakage current vs E (V/cm) for a sample interconnect structure according to an example embodiment of the present invention.

The next step is to compare the sample (measured) I-V profile with the reference I-V profile (baseline). For example, FIG. 3 shows the sample IV profile (see FIG. 2) on the same graph as the reference I-V profile (baseline).

If sample and reference I-V profiles are different then possibly a process defect in the sample structure.

If the sample I-V profile is significantly different from the reference I-V profile (baseline), a defect on the sample interconnect test structure is indicated. The defect could be a line etch defect, bridge, barrier defect or Cu CMP residue.

Certain criterion can be used to determine whether the measured I-V profile is normal or abnormal. The criterion should be selected based on the metallization system. Since the leakage current is very sensitive to defects, the leakage current will increase significantly if defects exist. For example, a 10-fold increase in the leakage current at 1 MV/cm can be set as the criterion for the most metallization systems. For low-k dielectrics, the criterion can be even larger.

Failure analysis should be conducted to find the root cause. Otherwise, the difference between the profiles is from the CD variation. The leakage currents at the certain electric field of structures can be calculated from the new measured I-V profile and baseline profile.

Fitting of I-V profile to the equation of leakage current mechanism (based on the previous fitting) can be used to check whether the difference between the measured I-V profile and the reference profile is from defects or CD variation.

If the work piece I-V profile is similar to the baseline I-V profile, then use I-V for calculations If the work piece I-V profile is similar to the baseline I-V profile, then leakage currents for the sample interconnect are calculated from the I-V at certain Voltages.

F. calculating the line spacing of the sample interconnect using the sample I-V profile using equations 7 or 8

We calculate the line spacing (line spacing CD) of the sample interconnect using the sample I-V profile and equations 7 or 8 based on the leakage current mechanism.

This method can be developed to be an effective in-line metrology tool or off-line E-test tool to measure and control the line CD.

The baseline I-V profile (e.g., current value at an electrical field) is used to calculate the line spacing for the sample work piece. The comparison of the sample profile and the baseline I-V profile can be used to determine if there are defects in the sample work piece and can be used to determine the leakage current conducting mechanism.

The baseline I-V profile can be used to determine some constants in equations 7 or 8. For example, when we search for the conducting mechanism by fitting the I-V curve to equation 7 or 8, the dielectric constant $k_i$ can be derived. Actually, the conducting mechanism is determined based on whether the value of $k_i$ is consistent with that from the other measurement (Note: $k_i$ is easy to be found the other method).

Referring to FIG. 4, We can see that the sample leakage current is 2.478 E−09 amps at 2 MV/cm. Using the equations above, we can calculate the CD line spacing for the sample to be 0.227 microns.

G. Some non-limiting benefits of some example embodiments

Some of the example embodiments can have some of the following benefits:

I-V profile measurement is significantly different from single voltage-point leakage current measurement.

I-V profile method provides much more information than single voltage-point leakage current measurement.

If the leakage current is measured at a small voltage, it is totally impossible to tell the difference between the leakage currents of the patterns with slightly different spaces.

Even if the leakage current is measured at around 2 MV/cm, the difference in the leakage current of around 55.8% shown in FIG. 7 is always considered to be the measurement variation in a typical single voltage-point leakage current measurement.

I-V profile measurement shows a very clear trend, and the resolution and credibility increase strongly, so it can be used to derive the line spacing The CD line spacing found from the I-V profile is the minimum CD of the region the test structure covered, not just the CD of the measurement point using CD-SEM, so the method is much more effective when designing a relative large structure.

The CD line spacing found from the I-V profile is the electric dimension, not the physical dimension from CD-SEM.

The CD line spacing found from the I-V profile is the final CD. In Cu processes, the Cu line spacing will be slightly changed in the Cu CMP stage.

The CD line spacing can be measured at any stage after Cu lines are formed.

It can detect the line defects such as etch defects, bridge, barrier layer issue, or Cu CMP residue.

H. other possible applications

The embodiments can be used on any other devices, in addition to horizontally spaced metal lines in dielectric layers. For example, the embodiments can be used to calculate/measure dielectric thickness between adjacent metal levels or be a contact and an adjacent metal line. The application depends on the calculation of electric field. Theoretically, as long as the electric field can be calculated, then the leakage current mechanism can be found by fitting, then the spacing can be calculated. So it is very easy to be used in adjacent metal levels. However, the capacitance measurement will be much easy if we design a large capacitor. For the case of a contact and an adjacent metal line, it can be used, but is difficult since the electric field distribution is very complicated. Actually, the measurement of thickness between metal lines in the sample layer is a best case to use this method.

I. contrast with single point leakage measurement

The example embodiments of the invention include a new method to monitor the line CD and defect of IC interconnect based on the leakage current profile (I-V profile) measurement of dielectrics. The new method is significantly different from the one voltage point leakage current measurement. The former method provides much more information than the latter one. If the leakage current measured at a small voltage, it is totally impossible to tell the difference between the leakage currents of the patterns with different spacings. Even the leakage current is measured at around 2 MV/cm, the difference in the leakage current around is always considered to be the measurement variation in a typical leakage current measurement. However, I-V profile measurement shows a very clear trend, and resolution and credibility increase strongly.

J. compare with SEM measurements

Some example embodiments' methods can have several advantages over the current CD-SEM:

The CD found from the I-V profile is the minimum CD of the region covered by the test structure, not just the CD of the measurement point obtained from CD-SEM, so the method is much more effective by designing a relative large structure.

The CD found from the I-V profile is the electric dimension, not the physical dimension from CD-SEM.

The CD found from the I-V profile is the final CD.

The line etch defect, bridge, barrier layer issue, or Cu CMP residue can be detected.

K. non-limiting example embodiments

Given the variety of embodiments of the present invention just described, the above description and illustrations shown shall not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of monitoring and measuring the line spacing of interconnects comprising the steps of:
   a) measuring an I-V profile of a sample interconnect structure to obtain a sample I-V profile comprising leakage current measurements at two or more voltages;
      said sample interconnect structure is comprised of spaced lines having a line spacing;
   b) comparing the sample I-V profile with a reference I-V profile at a reference line spacing to determine if sample interconnect structure is not defective;
      if the sample I-V profile is similar to the reference I-V profile, then leakage currents for the sample interconnect structure are derived from the I-V profiles at a selected voltage; and
   calculating the line spacing of the sample interconnect structure using the sample I-V profile.

2. The method of claim 1 which further comprises:
   measuring a reference I-V profile of a reference interconnect structure with a reference line spacing to obtain a reference I-V profile; said reference interconnect structure is at least partially in a reference insulation layer; and
   measuring the line spacing of the reference interconnect.

3. The method of claim 1 which further comprises:
   measuring a reference I-V profile of a reference interconnect structure with a reference line spacing to obtain a reference I-V profile; said reference interconnect structure is at least partially in a reference insulation layer;
   said reference interconnect structure is comprised of a comb-shaped section; and
   measuring the line spacing of the reference interconnect by a SEM or TEM technique.

4. The method of claim 1 which further comprises:
   if the sample I-V profile is significantly different from the reference I-V profile, sample interconnect device is determined to have a defect.

5. The method of claim 1 wherein the step of calculating the line spacing of the sample interconnect structure using the sample I-V profile comprises using equation 7:

$$\ln\left(\frac{J}{J_0}\right) = \frac{0.0146}{\sqrt{k_i}}\sqrt{\frac{V}{D_0}}\left[\left(\frac{D_0}{D}\right)^{1/2} - 1\right] \quad \text{Equation (7)}$$

for Schottky emission mechanism; or equation 8

$$\ln\left(\frac{J}{J_0}\right) = \ln\left(\frac{D_0}{D}\right) + \frac{0.0292}{\sqrt{k_i}}\sqrt{\frac{V}{D_0}}\left[\left(\frac{D_0}{D}\right)^{1/2} - 1\right] \quad \text{Equation (8)}$$

for Frenkel-Poole emission mechanism, wherein $J_0$ is the current density corresponding to the dielectric thickness of $D_0$, while J corresponds to D, $k_i$ is the dielectric constant and V is the voltage between metal lines.

6. The method of claim 1 wherein measuring the line spacing of interconnects comprises line spacing of interconnects of semiconductor devices.

7. A method of monitoring and measuring the line spacing of interconnects comprising the steps of:
   a) measuring an I-V profile of a reference interconnect structure with a reference line spacing to obtain a reference I-V profile; said reference interconnect structure is at least partially in a reference insulation layer;
      (1) said reference interconnect structure is comprised of spaced lines having a line spacing;
      (2) said I-V profile is comprised of leakage current measurements at two or more voltages;
      (3) said reference interconnect structure is comprised of a comb-shaped section;
   b) measuring the line spacing of the reference interconnect structure by a SEM or TEM technique;
   c) measuring an I-V profile of a sample interconnect structure to obtain a sample I-V profile;
   d) comparing the sample I-V profile with the reference I-V profile at a reference line spacing to determine if the sample interconnect structure is not defective;
      (1) if the sample I-V profile is significantly different than the reference I-V profile, then a process defect is determined to exist in the sample interconnect structure;
      (2) if the sample I-V profile is similar to the reference I-V profile, then leakage currents for the sample interconnect structure are derived from the I-V profiles at a selected voltage;
   e) calculating the line spacing of the sample interconnect structure using the sample I-V profile.

8. The method of claim 7 wherein the step of calculating the line spacing of the sample interconnect structure using the sample I-V profile comprises using equation 7 or equation 8:

$$\ln\left(\frac{J}{J_0}\right) = \frac{0.0146}{\sqrt{k_i}}\sqrt{\frac{V}{D_0}}\left[\left(\frac{D_0}{D}\right)^{1/2} - 1\right]; \quad \text{Equation (7)}$$

$$\text{or } \ln\left(\frac{J}{J_0}\right) = \ln\left(\frac{D_0}{D}\right) + \frac{0.0292}{\sqrt{k_i}}\sqrt{\frac{V}{D_0}}\left[\left(\frac{D_0}{D}\right)^{1/2} - 1\right]. \quad \text{Equation (8)}$$

wherein $J_0$ is the current density corresponding to the dielectric thickness of $D_0$, while J corresponds to D, $k_i$ is the dielectric constant and V is the voltage between metal lines.

9. The method of claim 7 wherein measuring the line spacing of interconnects comprises line spacing of interconnects of semiconductor devices.

10. A method of fabricating an IC comprising:
monitoring and measuring the line spacing of interconnects, wherein monitoring and measuring line spacing of interconnects comprises
   measuring an I-V profile of a sample interconnect structure to obtain a sample I-V profile comprising leakage current measurements at two or more voltages;
   said sample interconnect structure is comprised of spaced lines having a line spacing;
   comparing the sample I-V profile with a reference I-V profile at a reference line spacing to determine if sample interconnect structure is not defective;
   if the sample I-V profile is similar to the reference I-V profile, then leakage currents for the same interconnect structure are derived from the I-V profiles at a selected voltage; and
   calculating the line spacing of the sample interconnect structure using the sample I-V profile.

11. The method of claim 10 which further comprises:
measuring a reference I-V profile of a reference interconnect structure with a reference line spacing to obtain a reference I-V profile, wherein said reference interconnect structure is at least partially in a reference insulation layer; and
measuring the line spacing of the reference interconnect.

12. The method of claim 10 which further comprises:
measuring a reference I-V profile of a reference interconnect structure with a reference line spacing to obtain a reference I-V profile, wherein said reference interconnect structure is at least partially in a reference insulation layer and said reference interconnect structure is comprised of a comb-shaped section; and
measuring the line spacing of the reference interconnect by a SEM or TEM technique.

13. The method of claim 10 which further comprises determining the sample interconnect device to have a defect if the sample I-V profile is significantly different from the reference I-V profile.

14. The method of claim 10 wherein the step of calculating the line spacing of the sample interconnect structure using the sample I-V profile comprises using equation 7

$$\ln\left(\frac{J}{J_0}\right) = \frac{0.0146}{\sqrt{k_i}}\sqrt{\frac{V}{D_0}}\left[\left(\frac{D_0}{D}\right)^{1/2} - 1\right] \quad \text{Equation (7)}$$

for Schottky emission mechanism; or equation 8

$$\ln\left(\frac{J}{J_0}\right) = \ln\left(\frac{D_0}{D}\right) + \frac{0.0292}{\sqrt{k_i}}\sqrt{\frac{V}{D_0}}\left[\left(\frac{D_0}{D}\right)^{1/2} - 1\right] \quad \text{Equation (8)}$$

for Frenkel-Poole emission mechanism, wherein $J_0$ is the current density corresponding to the dielectric thickness of $D_0$, while J corresponds to D, $k_i$ is the dielectric constant and V is the voltage between metal lines.

* * * * *